United States Patent
Forshaw

(10) Patent No.: US 11,796,221 B2
(45) Date of Patent: Oct. 24, 2023

(54) CONNECTION BOX FOR CONDENSATE PUMPS IN AIR-CONDITIONING UNITS

(71) Applicant: Aspen Pumps Limited, Sussex (GB)

(72) Inventor: Christopher Forshaw, East Sussex (GB)

(73) Assignee: Aspen Pumps Limited, Sussex (GB)

( * ) Notice: Subject to any disclaimer, the term of this patent is extended or adjusted under 35 U.S.C. 154(b) by 874 days.

(21) Appl. No.: 16/753,202

(22) PCT Filed: Sep. 10, 2018

(86) PCT No.: PCT/GB2018/052567
§ 371 (c)(1),
(2) Date: Apr. 2, 2020

(87) PCT Pub. No.: WO2019/069045
PCT Pub. Date: Apr. 11, 2019

(65) Prior Publication Data
US 2020/0333039 A1    Oct. 22, 2020

(30) Foreign Application Priority Data

Oct. 3, 2017 (GB) ...................... 1716137

(51) Int. Cl.
*F24F 13/12* (2006.01)
*F24F 13/22* (2006.01)
(Continued)

(52) U.S. Cl.
CPC ............. *F24F 13/222* (2013.01); *H05K 1/02* (2013.01); *F24F 11/32* (2018.01);
(Continued)

(58) Field of Classification Search
CPC .... F24F 13/222; F24F 11/32; F24F 2013/227; F24F 11/30; F24F 13/22; H05K 1/02; F25D 21/14; F25D 2321/14; F25D 21/02
See application file for complete search history.

(56) References Cited

U.S. PATENT DOCUMENTS 4,909,041 A * 3/1990 Jones .................. F24D 11/0214
62/99
5,284,024 A * 2/1994 Hanson ................. F25D 29/003
62/130
(Continued)

FOREIGN PATENT DOCUMENTS

CN         202076495 U      12/2011
CN         103715683 A       4/2014
(Continued)

OTHER PUBLICATIONS

Chinese Office Action for corresponding CN Application No. 201880064082.2, dated Jan. 26, 2021, 8 pages.
(Continued)

*Primary Examiner* — Amine Benlagsir
(74) *Attorney, Agent, or Firm* — Seyfarth Shaw LLP

(57) ABSTRACT

The connection box of the present invention provides a simple and safe method to integrate an AC unit and condensate pump into a larger building management system. This is possible because the circuit is configured to require high water level sensors are connected to the connection box in order for power to be provided to operate the AC unit. An installer only has to connect the external wires of the AC unit, condensate pump and building management system to the respective designated connection terminals within the connection box. The designated terminal connections provide a clearly labelled instruction to an installer and aid safe (Continued)

and proper installation of AC units and remove the need to re-wire the internal wiring of the AC unit.

17 Claims, 5 Drawing Sheets

(51) Int. Cl.
    *H05K 1/02*           (2006.01)
    *F24F 11/32*         (2018.01)
    *F25D 21/14*        (2006.01)

(52) U.S. Cl.
    CPC ........ *F24F 2013/227* (2013.01); *F25D 21/14* (2013.01); *F25D 2321/14* (2013.01)

(56) References Cited

U.S. PATENT DOCUMENTS

| | | | |
|---|---|---|---|
| 5,291,745 A * | 3/1994 | Hanson | G05D 23/1912 62/157 |
| 5,684,463 A * | 11/1997 | Diercks | F24F 11/30 340/584 |
| 6,592,333 B1 * | 7/2003 | Magallanes | F24F 13/222 310/179 |
| 7,419,405 B1 * | 9/2008 | Landes | F24F 13/222 439/620.08 |
| 2004/0253918 A1 * | 12/2004 | Ezell | F24F 11/63 454/239 |
| 2006/0208915 A1 * | 9/2006 | Oakner | H01H 29/00 340/620 |
| 2012/0047927 A1 * | 3/2012 | Cantolino | F24F 11/30 62/150 |
| 2012/0222439 A1 * | 9/2012 | Pena | F24F 11/63 62/150 |
| 2013/0067941 A1 * | 3/2013 | Lee | F24F 11/46 62/126 |
| 2016/0294446 A1 * | 10/2016 | Rumler | H04B 5/0037 |
| 2017/0205103 A1 * | 7/2017 | Newcomb | F02G 5/04 |

FOREIGN PATENT DOCUMENTS

| | | |
|---|---|---|
| CN | 203574443 U | 4/2014 |
| CN | 203800596 U | 8/2014 |
| CN | 104089368 A | 10/2014 |
| CN | 104717985 A | 6/2015 |
| CN | 205481557 U | 8/2016 |
| CN | 106482215 A | 3/2017 |
| CN | 106885331 A | 6/2017 |
| CN | 206234923 U | 6/2017 |
| CN | 206410289 U | 8/2017 |
| JP | 2001217046 A | 8/2001 |
| JP | 2009207328 A | 9/2009 |
| WO | 2007124061 A2 | 11/2007 |

OTHER PUBLICATIONS

Household Air Conditioning Assembly and Maintenance Skills, Jing Shuguang et al., Sichuan University Press, Jul. 31, 2015, pp. 60-65.

International Search Report for Application No. PCT/GB2018/052567 dated Dec. 4, 2018, 5 pages.

Written Opinion for Application No. PCT/GB2018/052567 dated Dec. 4, 2018, 8 pages.

* cited by examiner

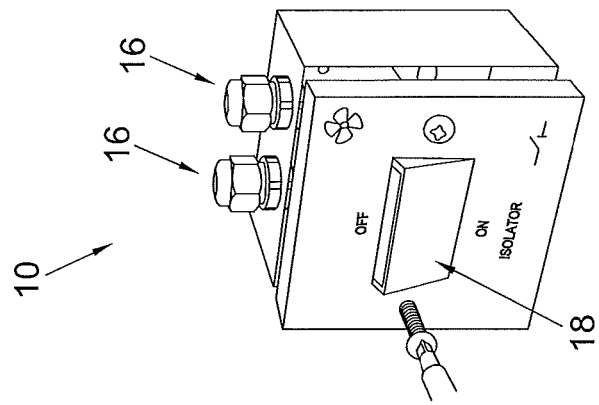
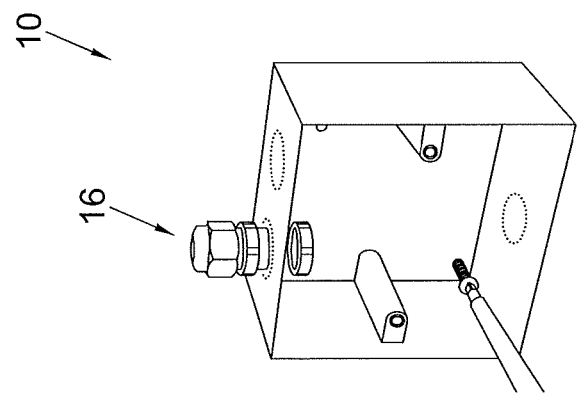
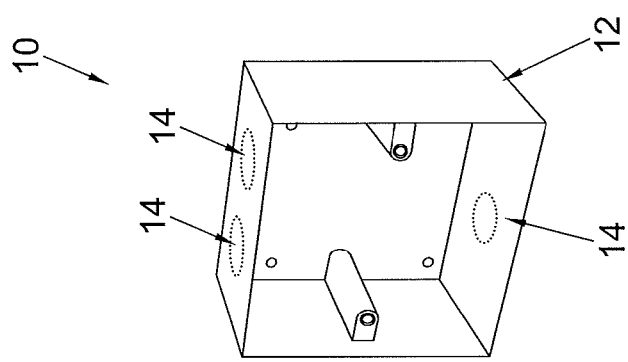

CONNECTION BOX FOR CONDENSATE PUMPS IN AIR-CONDITIONING UNITS

CROSS REFERENCE TO RELATED APPLICATIONS

This is a National Stage application of, and claims priority to, PCT/GB2018/052567, filed Sep. 10, 2018, which further claims priority to GB Patent Application No. 1716137.3, filed Oct. 3, 2017, the disclosures of which are incorporated herein by reference in their entirety.

BACKGROUND

Air-conditioning (AC) units are one of the most common methods of maintaining the temperature of a space and often use a refrigeration cycle which requires an evaporator and condenser. This allows warm air from a space to be blown over a refrigerant-cooled pipe and cooled before being returned to the space to be conditioned. However, one of the issues in this approach is the condensation that is formed on the pipes, as the warm humid air is cooled. This condensate is often left to drip off the pipes and is collected in a drip tray or reservoir before being drained away via gravity to a suitable drain. While a reservoir can simply be emptied periodically in a domestic situation, this is not practical in a commercial setting, where there may be a significant number of AC units located in a large number of locations, some of which may not be readily accessible, such as on roof-tops or the outside of walls. When it is not possible to rely on gravity to empty a drip tray, a pump may be used to drain any condensate from the reservoir.

In either setting, it is desirable to remove the need to have to manually empty the condensate reservoir and AC systems may include a condensate pump, to pump condensate out of the reservoir. Thus a smaller reservoir can be used, as the reservoir now acts as a funnel to transfer liquid into the drainage system, which makes for a more appealing AC unit. However, in some cases, the condensate pump may not be able to empty the reservoir sufficiently quickly or may be malfunctioning, which can result in an overflowing reservoir, potentially causing water to be introduced to the electronics of the system or any neighbouring systems. Large accumulations of condensate can also result in water damage to floors, walls and ceilings of a building which can render a structure unsafe. Therefore, it is essential that condensate reservoirs are effectively monitored and emptied. In such cases, AC units will come with a high level alert switch for shutting down the AC unit to prevent this situation. By not having moving parts, gravity-assisted devices are generally more reliable, but may still be fitted with such a switch. As condensate pumps include moving parts, they are less reliable, and so may be fitted with a water level switch. However, there may be scenarios where the risk of an overflowing reservoir is acceptable and indeed preferable to shutting down the AC unit. Examples of systems where it may be preferable to keep an AC unit running in the event of a high water level may include cold storage rooms for medical equipment or samples, vaccines, food storage units, AC system for server rooms or manufacturing equipment.

It is also desirable to centralise the control of AC systems with other infrastructure systems such as lighting and security to provide a more energy efficient and effectively managed home or office building. In this case, having a central building management system (BMS) means all the systems of the building can be controlled in one location and the infrastructure within a building can be centrally managed. However, in most instances configuring an AC unit and condensate pump to work in the desired manner within a BMS requires re-wiring the electronics of the constituent parts of the system, namely the AC unit and the condensate pump, so that they are able to communicate with the BMS. This is a time-consuming and complex process, because integrating an AC unit and condensate pump into a BMS requires an installer to be able to read and interpret the wiring circuit diagram as well as be able to wire the system properly. This means an installer must open the AC unit to access the internal wiring of the unit to install the unit. Safety sensors and switches are often not connected properly or in some cases at all. An incorrectly installed system leads to a greater risk of fire and/or flooding. Even in standard installations, that is to say where a BMS is not present, AC units can also be difficult install, as installers may find it difficult to understand how to wire in a condensate pump safety switch. Therefore, whether there is a BMS or not, configuring a condensate pump to operate properly and safely with an AC unit requires technical knowledge to ensure high water level alerts are received and AC units are configured correctly to switch off or remain powered in the event of high water level alerts.

BRIEF SUMMARY OF THE DISCLOSURE

Viewed from a first aspect, the present invention provides a connection box for condensate pumps in air-conditioning systems. The connection box includes a housing arranged to support a printed circuit board including a first set of connection terminals designated as a live input and a neutral input, a second set of connection terminals configured to connect to a condensate pump of an air-conditioner unit designated as a first sensor connection terminal for receiving a detection signal from a water level sensor in a condensate pump, a first live output and a first neutral output, and a third set of connection terminals configured to connect to an evaporator of an air-conditioning unit designated as a second live output and a second neutral output, and an isolator switch arranged at the live input. Designating the connection terminals in this way provides the installer with clearly labelled instructions regarding what connection needs to be made at each terminal connection to correctly and safely install the AC unit and condensate pump. The safety switch, from the condensate pump, is wired into the mains supply and into the evaporator. By providing the connection box in a normally closed (N/C) configuration, detection of a fault (i.e. a high water level) will stop current flowing to the evaporator and shut the AC unit off. Where the condensate pump is to be connected to a BMS, the logic of operation can be switched to normally open, so that current will continue to flow to the evaporator upon detection of a fault, and will additionally flag an issue with the AC system to the BMS. As power is not provided to the evaporator of the AC unit without connection of the condensate pump, and its associated high water level sensors, the condensate pump provides the safety mechanism for the AC system. The live input is connected to the first live output. The neutral input is connected to the first and second neutral outputs. The first sensor connection terminal is connected to the second live output. The second live output is closed in response to the detection signal. The first, second and third sets of terminal connections are located within a first, second and third terminal block respectively. The first, second and third terminal blocks are located at spatially separated regions of the printed circuit board (PCB). Arranging the terminal blocks such that they are located at spatially separated regions of the PCB enhances the readability of the labels printed on the PCB and simplifies the PCB layout which reduces the risk of incorrect connections being made by an installer. Aside from providing a clearly labelled designation for each connection terminal, spacing the connection terminals on the PCB also provides sufficient space for the installer to insert fingers and tools between the terminals blocks when configuring the connection box. Further, the provision of terminal blocks allows for a much easier way to connect the wires of the evaporator and condensate pump to the connection box, as simple tools, such as a screwdriver, are all that is required to secure the wires from each part of the AC system to the connection box. It also allows single wire cores to be fitted into its relevant terminal rather than be doubled up with other wire cores. This ensures that good and safe electrical connections are made. Introducing a separate connection box also means there is no need to open the AC unit to access and connect to the internal wiring of the unit during installation.

The present invention may also include a connection box with a fourth set of connection terminals having a designated common connection terminal, a designated normally open connection terminal and a designated normally closed connection terminal. The fourth set of connection terminals may be configured to connect to a relay circuit and a control module, and the first sensor connection terminal is connected to the control module via the relay circuit. This embodiment of the invention is advantageous as it allows the AC unit and condensate pump to be integrated into a system including a control module (typically a BMS). The fourth set of connection terminals are independent to the first, second and third sets of connection terminals and provide clear designations as to how to connect the BMS to the AC system, without further complicating the method of configuring the AC system. This embodiment offers a simple wiring solution which allows a condensate pump and AC unit to be configured to operate in as part of a larger BMS. Connecting the fourth set of connection terminals to a BMS means faults or high water alerts can be transmitted to a BMS without additional wiring beyond those of the fourth set of connections.

This in itself is believed to be a novel feature and thus viewed from a second aspect, the present invention provides a connection box for condensate pumps in air-conditioning systems. The connection box includes a housing arranged to support a printed circuit board including a first set of connection terminals designated as a live input and a neutral input, a second set of connection terminals configured to connect to a condensate pump of an air-conditioner unit designated as a first sensor connection terminal for receiving a detection signal from a water level sensor in a condensate pump, a first live output and a first neutral output, a third set of connection terminals configured to connect to an evaporator of an air-conditioning unit designated as a second live output and a second neutral output, and a fourth set of connection terminals configured to connect to a relay circuit and a control module having a designated common connection terminal, a normally open connection terminal and a normally closed connection terminal, and an isolator switch arranged at the live input. The live input is connected to the first live output. The neutral input is connected to the first and second neutral outputs. The first sensor connection terminal is connected to the second live output. The second live output is closed in response to the detection signal. The first sensor connection terminal is connected to the control module via the relay circuit.

According to the first or the second aspect, the invention may comprise the fourth set of terminal connections being located within a fourth terminal block, with the first, second, third and fourth terminal blocks being located at spatially separated regions of the printed circuit board.

Receipt of the detection signal may cause a high water level alert to be transmitted to the control module via the relay circuit.

The control module may be a building management system. This enables a high water alert to shut down the AC unit while alerting maintenance personnel of the alert.

The common connection may be configured to connect to the control module via wired or wireless means.

The relay circuit may be configured to be normally-open.

The second live output may be a switched live output. Receipt of the detection signal may close the switched live output and shut down the evaporator.

Alternatively, the second live output may be a permanent live output and the first sensor connection terminal may be connected to the live input. This embodiment is advantageous, as it enables critical equipment to be maintained even in the event of a fault or high water alert in the AC system.

According to another embodiment, the third set of connection terminals comprises a designated third live output connection terminal, the second set of connection terminals comprises a designated second sensor connection terminal, the second live output is designated as a switched live output connection terminal, the third live output is designated as a permanent live output connection terminal, and the second sensor connection terminal is connected to the live input. This enables an installer to configure the connection box to either maintain power to the evaporator or shut down the evaporator in response to receiving a detection signal by connecting the evaporator either to the permanent live output or to the switched live output respectively. This embodiment is particularly advantageous, as it offers a simple wiring solution which allows a condensate pump and AC unit to be configured to operate in either a switched live or permanent live mode of operation by only having to choose between the clearly designated switched or permanent live connection terminals. The remaining wiring is the same for either mode of operation.

This in itself is believed to be a novel feature and thus viewed from a third aspect, the present invention provides a connection box for condensate pumps in air-conditioning systems. The connection box includes a housing arranged to support a printed circuit board including a first set of connection terminals designated as a live input and a neutral input, a second set of connection terminals configured to connect to a condensate pump of an air-conditioner unit designated as a first sensor connection terminal and a second sensor connection terminal for receiving a detection signal from a water level sensor in a condensate pump, a first live output and a first neutral output, and a third set of connection terminals configured to connect to an evaporator of an air-conditioning unit designated as a second live output, a third live output and a second neutral output, and an isolator switch arranged at the live input. The live input is connected to the first live output. The neutral input is connected to the first and second neutral outputs. The second live output is designated as a switched live output and the first sensor connection terminal is connected to the switched live output. The third live output is a permanent live output and the second sensor connection terminal is connected to the live input. This embodiment is particularly advantageous, as it enables an installer to configure the connection box to either maintain power to the evaporator or shut down the evaporator in response to receiving a detection signal by connecting the evaporator either to the permanent live output or to the switched live output respectively.

Receipt of the detection signal may close the second live output and shuts down the evaporator.

The electrical connection between the second sensor connection terminal and the first live output may be fused.

The first set of connection terminals may further include a designated earth input terminal connection, the second set of connection terminals may further include a designated earth output terminal connection and the earth input may be connected to the earth output.

The first set of terminal connections may further include a designated input communication connection terminal, the second set of connection terminals may further include a designated output communication connection terminal, and the input communication connection terminal may be connected to the output communication connection terminal. This is advantageous, as separate input and output communication connection terminals allows only the AC unit to be shut off in the event of a trigger, such as a pump fault or detection signal. If the entire system was switched off, any control units or control modules would have no record of what caused the system shut down.

While embodiments of the invention may include connections for a control module such as a BMS, embodiments of the invention comprising only the first, second and third sets of terminal connections are still advantageous as they provide a safe and simple way of installing an AC unit and condensate pump where there is no building management system (BMS) or other external control system, such as a home automation or smart home system.

Thus the present invention provides a connection box which offers a simple and safe method to integrate an AC unit and condensate pump into a larger building management system without needing to re-wire any of the constituent parts of the system. This is possible because the circuit is configured to require high water level sensors are connected to the connection box in order for power to be provided to operate the AC unit. An installer only has to connect the external wires of the AC unit, condensate pump and building management system to the respective designated connection terminals within the connection box and not have to worry about having to modify the wiring of the AC unit or condensate pump to provide the configurable operating modes described above. The designated terminal connections provide a clearly labelled instruction to an installer and aid safe and proper installation of AC units and remove the need to re-wire the internal wiring of the AC unit.

BRIEF DESCRIPTION OF THE DRAWINGS

Embodiments of the invention are further described hereinafter with reference to the accompanying drawings, in which:

FIG. 1A is an example of a connection box housing;

FIG. 1B is an example of a connection box housing with a cable gland entry ready for a cable to be inserted into the connection box;

FIG. 1C is an example of a connection box housing with an isolator switch;

DETAILED DESCRIPTION

Figure 2:
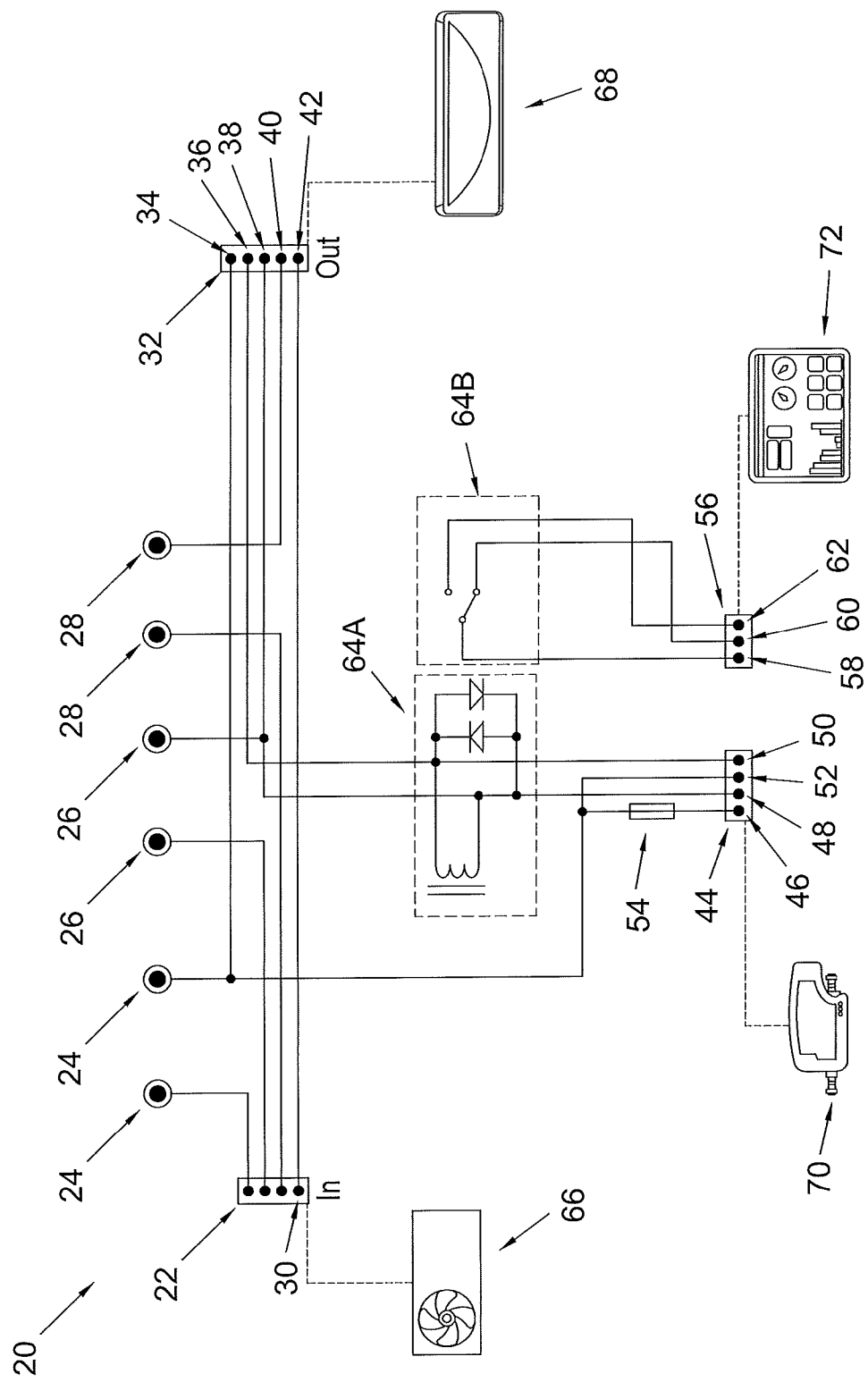
FIG. 2 is an exemplary circuit arrangement for a connection box.

FIG. 1A is an example of a known connection box 10 having a housing 12 with cable gland entry ports 14 which can be drilled or punched through to provide access to the internal space of the connection box 10.

FIG. 1B is an example of a known connection box 10 where a cable gland entry port 14 has been knocked through and a cable gland 16 fitted within the entry port 14.

FIG. 1C is an example of a known connection box 10 where two cable gland entry ports 14 have been knocked through and two cable glands 16 have been fitted within the entry port 14. The two cable glands 16 may connect to different electrical systems, such as the condenser of an AC unit, the evaporator of an AC unit, a building management system, mains power, a water sensor or a condensate pump. FIG. 1C also shows an isolator switch fitted to the housing.

FIG. 2 is an exemplary circuit arrangement 20 for a connection box having a first terminal block 22 with a live input connection terminal 24, a neutral input connection terminal 26, an earth input connection terminal 28 and an input communication connection terminal 30. As shown in FIG. 2, terminal block 22 is connected to a condenser 66. However, terminal block 22 may be connected to alternative sources of power, such as mains power or an indoor power unit. Condenser 66 may also be contained within an AC system.

Also shown in FIG. 2 is terminal block 32 which has a designated live output connection terminal 34 a switched live output connection terminal 36, a neutral output connection terminal 38, an output communication connection terminal 40 and an earth output connection terminal 42. As shown, terminal block 32 is connected to an evaporator unit 68, which may be part of an AC system.

Also shown in FIG. 2 is terminal block 44 which is connected to a condensate pump 70, which may be part of an AC system. Terminal block 44 has a designated permanent live connection terminal 46, a neutral output connection terminal 48, a first sensor connection terminal 50, and a second sensor connection terminal 52. Terminal block 44 is for receiving a high water level detection signal from a water level sensor within condensate pump 70. The detection signal is received by first high level sensor 50 and second high level sensor 52 and is used to trigger a configured response of the connection box. The connection box is configured to respond to the detection signal by either maintaining power to the evaporator 68 or by switching off power to the evaporator 68. A fuse 54 is also shown connected between the permanent live connection terminal 46 and the live input connection terminal 24. By requiring the condensate pump 70 and high water level sensors 50, 52 be connected to the connection box for the evaporator 68 of the AC unit to receive any power to operate, this provides an additional safety measure to ensure proper installation of the AC unit. Having the condensate pump 70 act as the safety trigger for the system to shut the AC unit down and/or notify a building management system 72 prevents installers, intentionally or otherwise, from being able to bypass the safety connections of the AC unit during installation.

Also shown in FIG. 2 is terminal block 56 which is connected to a relay circuit 64 and a building management system 72. The building management system 72 is a computerised system which monitors and controls the infrastructure within a building using control modules communicating via protocols such as C-Bus, XML, or Internet protocols. This infrastructure typically includes ventilation, air-conditioning, lighting, power and security systems. The control module includes any type of building management system 72 or other external control system, such as a home automation or smart home system, where the ability to monitor and control the equipment associated with infrastructure systems is desirable. Such infrastructure systems would typically include air-conditioning units containing evaporator units 68 and condensers 66 and therefore data regarding the state of this equipment would be transferred to a centralised control system to manage the equipment. Such systems can be an essential part of regulating a building's infrastructure in an energy efficient manner. Poorly controlled infrastructure can result in significant waste energy or result in system faults going undetected for significant periods of time. A building may have a large number of AC units, all of which may have different operating requirements. Therefore, a centralised system to monitor all of these units is significantly more desirable than manually monitoring and controlling the units. Additionally, if a fault or high water level signal is detected, the building management system may check other data sources from the location of the AC unit returning a fault or high water level signal. For example, a video camera or temperature sensor located near the AC unit returning a fault may provide additional information to help building maintenance personnel determine whether there is in fact a fault or high water condition before sending an individual to investigate the faulty AC unit. Terminal block 56 has a common connection terminal 58, a normally open "N/O" connection terminal 60 and a normally closed "N/C" connection terminal 62. This allows the high water level alert to be communicated to the building management system 72 independently of the state of evaporator 68, which enables the AC unit to send a fault even if the evaporator of the AC unit is switched off, either due to a fault or because there is no need for air-conditioning at that time or location.

While FIG. 2 shows the connection terminals are part of four separate terminal blocks 22, 32, 44 and 56, the connection terminals may be contained in more or fewer blocks, or not be contained within any terminal blocks at all. In this case, connection terminals would be soldered directly to the printed circuit board (PCB) according to the labelled inputs and outputs. FIG. 2 shows a connection between the live input connection terminal 24 and the permanent live output connection terminal 34 in addition to the connection between the first sensor connection terminal 50 and the switched live output connection terminal 36. Implementation of the connection box requires only one of these connections to be established, as described in the subsequent text and Figures.

While the earth input 28 and earth output 42 connection terminals enable mains power or power from an indoor power unit to be earthed safely, they are not essential to all embodiments of the invention. Similarly, while the input communication 30 and output communication 40 connection terminals allow pump faults or high water level alerts to be communicated to/from the evaporator 68, they are not essential features in all embodiments of the invention. While connections to a relay circuit 64 and control module allow the AC unit and condensate pump 70 to be safely and simply integrated into a BMS 72, these connections are not essential in all embodiments of the invention. Embodiments of the invention comprising only the first, second and third sets of terminal connections are still advantageous as they provide a safe and simple way of installing an AC unit and condensate pump 70 in systems where there is no BMS 72 or other external control system, such as a home automation or smart home system.

Figure 3:
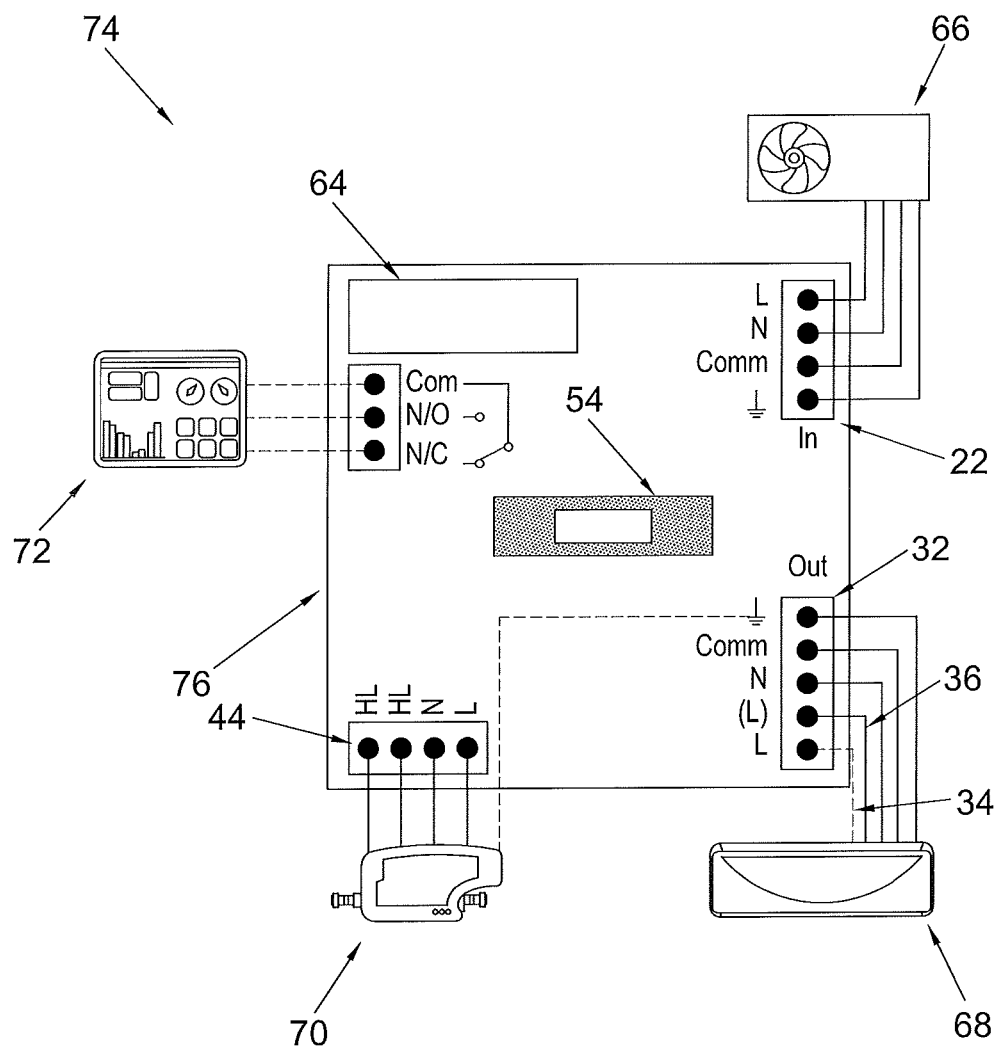
FIGS. 3 to 5 are an exemplary arrangements of a connection box.

FIG. 3 shows an exemplary arrangement 74 of a connection box with a PCB 76 on which there is a first terminal block 22 with a set of input connection terminals designating a live input ("L"), a neutral input ("N"), an input communication ("Comm") and an earth input. Terminal block 32 is shown with a set of connection terminals designated as a permanent live output ("L"), a switched live output ("(L)"), a neutral output ("N"), an output communication ("Comm") and an earth output. Terminal block 44 is shown including a set of connection terminals designated as a first high level sensor input ("HL"), a second high level sensor input ("HL"), a permanent live output ("L") and a neutral output ("N"). Terminal block 56 is shown with a designating a common connection terminal ("Com"), a designated normally-open connection terminal ("N/O") and a designated normally-closed connection terminal ("N/C").

The terminal blocks are arranged to be at spatially separated regions of the PCB 76 surface to enhance the readability of the labels printed on the PCB 76. As shown in FIG. 3, the terminals blocks are arranged to be at opposed corners of the PCB 76. However, other spatially separated arrangements which allow the labels of the connection terminals to be read clearly and which provide sufficient space to insert fingers and tools between the terminals blocks to configure the connection box are conceived by this description. Spacing the terminal blocks apart from one another provides a clear and simple way for an installer to safely and correctly configure the connection box to work with, for example, an AC unit, a building management system 72 and a condensate pump 70. As shown, neither of the permanent live output 34 nor switched live output 36 connection terminals is connected. In this configuration, an installer will need to connect the live wire from the evaporator unit 68 to either the permanent live output 34 or the switched live output 36, depending on the desired configuration. Compared to reconfiguring the internal wiring of an AC unit so that it operates with a condensate pump 70 and is integrated with a BMS 72, connecting the live connection to the AC unit to one of two designated connection terminals is a much simpler way of configuring an AC unit to work within a building management system 72, as there is no need to modify the wiring of the AC unit itself to work with the building management system 72. Further the ability to change between switched live power and permanent live power in such a simple manner is possible through the arrangement of connection terminals and the configuration of the connection terminals within the connection box as described in FIG. 2.

Figure 4:
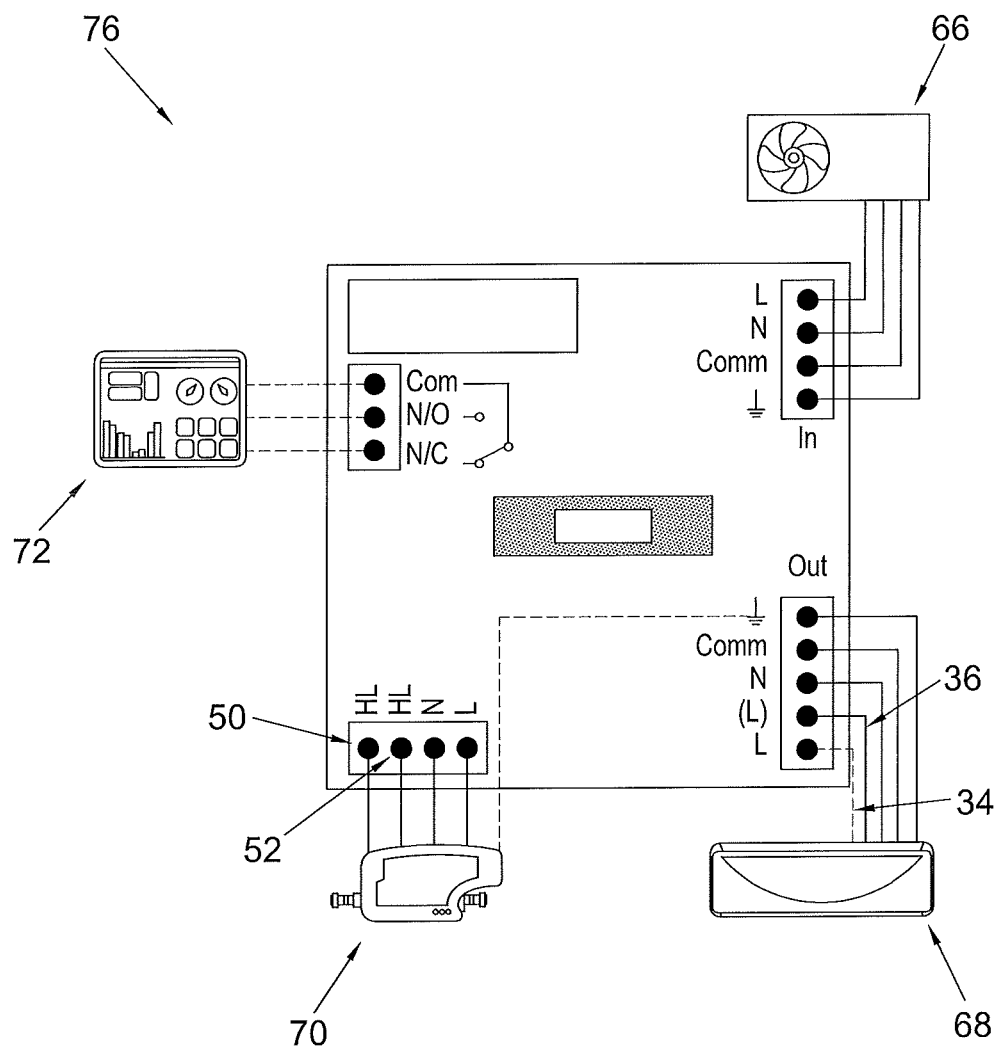

FIG. 4 shows an exemplary arrangement 76 of a connection box where an evaporator 68 is connected to the switched live output connection terminal 36 of the connection box. In this arrangement 76, detection of a high water level results in the condensate pump 70 sending a detection signal to the first sensor connection terminal 50 and closes the switched live output connection terminal 36. This causes evaporator 68 to be shut down in response to receiving a detection signal indicating a high water level condition, prevents the condensate reservoir from overflowing. Independent to the operating state of the evaporator 68, the connection box is also able to send a high water level alert to the building management system 72 via the relay circuit 64 to indicate a high water level situation. Therefore, even though evaporator 68 is off, condensate pump 70 can continue to pump fluid out of the AC system and lower the water level of a condensate reservoir (not shown) which filled during operation of the AC system.

If a connection box needs to be reconfigured, for example, if the current configuration is for switched live output 36 and a permanent live output 34 is desired, such as shown in FIG. 4 an installer simply needs to change the connection from the switched live output connection terminal 36 to the permanent live output connection terminal 34. No further modifications to the connection box are required. This configuration is shown in FIG. 5.

Figure 5:
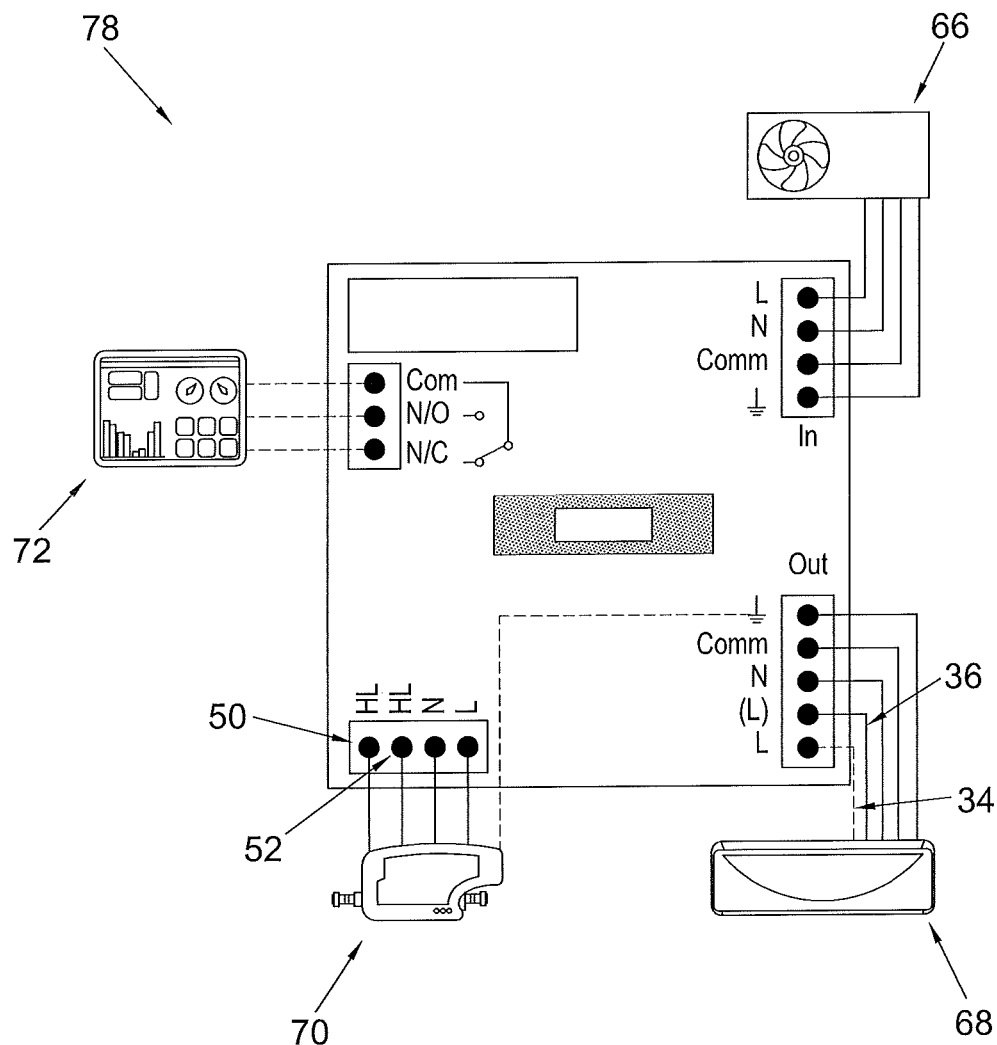

FIG. 5 shows an exemplary arrangement 78 of a connection box with an evaporator 68 connected to the permanent live output connection terminal 64 of the connection box with no wires connected to the switched live output 36. In this example, detection of a high water level would not result in the evaporator 68 being shut off. The connection box may also send a signal to the building management system 72 via the relay circuit to indicate a high water level alert and that the AC unit remains on. If it is desirable to reconfigure the connection box to provide a switched live output instead of a permanent live output, an installer simply needs to connect the live wire from the evaporator 68 to the switched live output connection terminal 36 instead of the permanent live output connection terminal 38.

The connection box of the present invention provides a simple and safe method to integrate an AC unit and condensate pump into a larger building management system. This is possible because the circuit is configured to require connection of the high water level sensors to the connection box in order for power to be provided to operate the AC unit. An installer only has to connect the external wires of the AC unit, condensate pump and building management system to the respective designated connection terminals within the connection box and does not have to worry about having to modify the wiring of the AC unit or condensate pump to provide the configurable operating modes described above. The designated terminal connections provide a clearly labelled instruction to an installer and aids safe and proper installation of AC units and remove the need to re-wire the internal wiring of the AC unit. Incorporating the designated terminal connections as described in AC systems will substantially reduce any errors by an installer during installation of an AC system and pump.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A connection box for condensate pumps in air-conditioning systems comprising:
    a housing arranged to support a printed circuit board;
    the printed circuit board comprising a first set of connection terminals designated as a live input and a neutral input, a second set of connection terminals configured to connect to a condensate pump of an air-conditioner unit designated as a first sensor connection terminal for receiving a detection signal from a water level sensor in the condensate pump, a first live output and a first neutral output, and a third set of connection terminals configured to connect to an evaporator of the air-conditioner unit designated as a second live output and a second neutral output, and
    an isolator switch arranged at the live input,
    wherein the live input is connected to the first live output,
    wherein the neutral input is connected to the first neutral output and the second neutral output,
    wherein the first sensor connection terminal is connected to the second live output,
    wherein the second live output is closed in response to the detection signal,
    wherein the first set of connection terminals, the second set of connection terminals and the third set of connection terminals are comprised within a first terminal block, a second terminal block and a third terminal block respectively, and
    wherein the first terminal block, the second terminal block and the third terminal block are located at spatially separated regions of the printed circuit board.

2. The connection box according to claim 1, further comprising a fourth set of connection terminals comprising a designated common connection terminal, a designated normally open connection terminal and a designated normally closed connection terminal, wherein the fourth set of connection terminals is configured to connect to a relay circuit and a control module, and wherein the first sensor connection terminal is connected to the control module via the relay circuit.

3. A connection box for condensate pumps in air-conditioning systems comprising:
    a housing arranged to support a printed circuit board;
    the printed circuit board comprising a first set of connection terminals designated as a live input and a neutral input, a second set of connection terminals configured to connect to a condensate pump of an air-conditioner unit designated as a first sensor connection terminal for receiving a detection signal from a water level sensor in the condensate pump, a first live output and a first neutral output, a third set of connection terminals configured to connect to an evaporator of the air-conditioner unit designated as a second live output and a second neutral output, and a fourth set of connection terminals configured to connect to a relay circuit and a control module comprising a designated common connection terminal, a normally open connection terminal and a normally closed connection terminal, and
    an isolator switch arranged at the live input,
    wherein the live input is connected to the first live output,
    wherein the neutral input is connected to the first neutral output and the second neutral output, wherein the first sensor connection terminal is connected to the second live output,
wherein the second live output is closed in response to the detection signal, and
wherein the first sensor connection terminal is connected to the control module via the relay circuit.

4. The connection box according to claim 3, wherein the fourth set of connection terminals are comprised within a fourth terminal block, and wherein a first terminal block, a second terminal block, a third terminal block and the fourth terminal block are located at a spatially separated regions of the printed circuit board.

5. The connection box according to claim 3, wherein the receipt of the detection signal causes a high water level alert to be transmitted to the control module via the relay circuit.

6. The connection box according to claim 3, wherein the control module is a building management system.

7. The connection box according to claim 3, wherein the designated common connection terminal is configured to connect to the control module via wired or wireless means.

8. The connection box according to claim 3, wherein the relay circuit is configured to be normally-open.

9. The connection box according to claim 3, wherein the second live output is a switched live output.

10. The connection box according to claim 9, wherein the receipt of the detection signal closes the switched live output and shuts down the evaporator.

11. The connection box according to claim 3, wherein the second live output is a permanent live output, wherein the first sensor connection terminal is connected to the live input.

12. The connection box according to claim 3, wherein the third set of connection terminals further comprises a designated third live output connection terminal, wherein the second set of connection terminals further comprises a designated second sensor connection terminal, wherein the second live output is designated as a switched live output connection terminal, wherein the designated third live output connection terminal is designated as a permanent live output connection terminal, and wherein the designated second sensor connection terminal is connected to the live input, whereby an installer can configure the connection box to maintain power to the evaporator or shut down the evaporator in response to said receiving the detection signal by connecting the evaporator either to the permanent live output connection terminal or to the switched live output connection terminal respectively.

13. A connection box for condensate pumps in air-conditioning systems comprising:
a housing arranged to support a printed circuit board;
the printed circuit board comprising a first set of connection terminals designated as a live input and a neutral input, a second set of connection terminals configured to connect to a condensate pump of an air-conditioner unit designated as a first sensor connection terminal and a second sensor connection terminal for receiving a detection signal from a water level sensor in the condensate pump, a first live output and a first neutral output, and a third set of connection terminals configured to connect to an evaporator of the air-conditioner unit designated as a second live output, a third live output and a second neutral output, and
an isolator switch arranged at the live input,
wherein the live input is connected to the first live output,
wherein the neutral input is connected to the first neutral output and the second neutral output,
wherein the second live output is designated as a switched live output and the first sensor connection terminal is connected to the switched live output,
wherein the third live output is a permanent live output and the second sensor connection terminal is connected to the live input, and
whereby an installer can configure the connection box to maintain power to the evaporator or shut down the evaporator in response to said receiving the detection signal by connecting the evaporator either to the permanent live output or to the switched live output respectively.

14. The connection box according to claim 13, wherein the receipt of the detection signal closes the second live output and shuts down the evaporator.

15. The connection box according to claim 13, wherein an electrical connection between the second sensor connection terminal and the first live output is fused.

16. The connection box according to claim 13, wherein the first set of connection terminals further comprises a designated earth input connection terminal, wherein the second set of connection terminals further comprises a designated earth output connection terminal, and wherein the designated earth input terminal connection is connected to the designated earth output terminal connection.

17. The connection box according to claim 13, wherein the first set of connection terminals further comprises a designated input communication connection terminal, wherein the second set of connection terminals further comprises a designated output communication connection terminal, and wherein the designated input communication connection terminal is connected to the designated output communication connection terminal.

* * * * *